United States Patent [19]

D'Antonio et al.

[11] Patent Number: 4,996,519
[45] Date of Patent: Feb. 26, 1991

[54] METHOD AND APPARATUS FOR MONITORING AN AMPLIFIER

[75] Inventors: Michael J. D'Antonio, Salem; Irving A. Gibbs, Roanoke; Lawrence J. Lane, Salem; Rodney A. Lawson, Fincastle, all of Va.

[73] Assignee: General Electric Company, Salem, Va.

[21] Appl. No.: 411,977

[22] Filed: Sep. 25, 1989

[51] Int. Cl.$^5$ .................................................. G08B 21/00
[52] U.S. Cl. ........................................ 340/653; 330/2; 322/99
[58] Field of Search ................ 340/653; 324/158 MG, 324/511, 537; 322/20, 21, 99; 330/2

[56] References Cited
U.S. PATENT DOCUMENTS

| | | | |
|---|---|---|---|
| 3,434,065 | 3/1969 | Chu et al. | 330/2 |
| 3,718,857 | 2/1973 | Bernard | 330/2 |
| 4,454,503 | 6/1984 | Nelson et al. | 340/653 |
| 4,855,644 | 8/1989 | Lane | 322/19 |

Primary Examiner—Joseph A. Orsino
Assistant Examiner—Jill Jackson
Attorney, Agent, or Firm—Arnold E. Renner

[57] ABSTRACT

A method and apparatus for enabling the continuous monitoring of the operational state of circuit components includes a scheme for generating a plurality of voltage signals representing neutral-to-line voltages of the system and adding to each of those signals a second signal, each second signal being identical. This addition is done vectorially to yield a modified signal. A representation of the modified signal as acted upon by the circuit to be monitored is compared with a representation of the neutral-to-line voltage signal to yield an output signal representative of the operational state of the circuit components.

27 Claims, 6 Drawing Sheets

METHOD AND APPARATUS FOR MONITORING AN AMPLIFIER

BACKGROUND OF THE INVENTION

The present invention relates generally to monitoring electrical circuit components and more particularly to a method and apparatus for continuously monitoring the operational condition of electrical circuits which may provide the same output in response to a normal operating condition and to a failed circuit condition.

In certain instances, electrical circuitry such as control circuitry, may provide the same output in response to a normal operating condition and a failure condition. As an example, in certain amplifying control circuitry there may be a zero output in response to a zero input, indicating that there is no extant error condition, and the same zero condition may also exist if the circuit were to fail. In such situations, it is often difficult to determine that this circuit or component is functionally operative. It is possible, of course, to periodically apply a test signal and to check that the output is of a normal value. This method, however, has two basic problems. The first of these problems is that if the circuit is in a direct feedback loop, it must be disconnected from that loop in order not to disturb the system being controlled. The second major drawback is that this type of an arrangement does not provide for the continuous monitoring of the circuit or component.

As an example in which the above situation exists, attention is called to the U.S. Pat. No. 4,855,644 "Method and Apparatus for Damping Oscillations of AC Generator" by L. J. Lane, issued Aug. 8, 1989. As recognized in that patent, the speed of a given generator can oscillate above or below its synchronous speed such that its period of oscillation is in the approximate range of 0.2 to 2.0 seconds. It is known that the generator can effect very little damping to electromechanical oscillations which can result in spontaneous oscillations or even loss of synchronism with the power system and the attendant large voltage differentials. Mechanical oscillation and loss of synchronism may affect the operational life of the generator and the reliability of the power system. This patent describes a polyphase system in which each phase includes circuitry, including an amplifier, for controlling the generator field excitation. Since the generator may remain in a quiescent state not requiring any change in generator excitation through a power system stabilizer, it is seen that the output of the circuitry could remain at zero for long periods of time. The concern with this system is that because the generator may remain in the quiescent state for comparatively long periods of time with no change in output signal, there is no assurance that the circuitry is continuously operable.

SUMMARY OF THE INVENTION

It is, therefore, an object of the present invention to provide a method and apparatus for enabling the monitoring of the operational status of certain electrical circuitry.

It is a further object to provide a method and apparatus for enabling the monitoring of the operational state of circuits and circuit components employed in an electrical system operating on line-to-line voltages.

It is a still further object to provide a method and apparatus for continuously monitoring the operational state of an electrical circuit, especially an amplifier circuit.

An additional object is to provide a method and apparatus for monitoring the operational state of an amplifier employed in a polyphase system for stabilizing a generator.

The foregoing and other objects are achieved, in accordance with the present invention, by a scheme which enables the monitoring of circuit components in a polyphase electrical system operating on line-to-line voltages through the generation of a plurality of voltage signals respectively representing neutral-to-line voltages of said system and vectorially adding to each of said voltage signals an identical signal (a transmission signal) whereby there results a corresponding plurality of modified neutral-to-line voltage signals without modification of line-to-line voltages. The present invention further provides for the monitoring of the operational state of an amplifier by providing an input signal comprised of two components to the amplifier and then comparing the output of that amplifier with an additional signal which represents one of the two components of the input to the amplifier which has been operated upon by a gain corresponding to the gain of the amplifier. In a preferred usage, the amplifier and its monitoring system are employed in a polyphase system for stabilizing a generator to assure that certain circuitry for the generator is operational at all times.

BRIEF DESCRIPTION OF THE DRAWING

While the present invention is defined in particularity in the claims annexed to and forming a part of this specification, a better understanding thereof can be had by reference to the following description taken in conjunction with the accompanying drawing in which:

DETAILED DESCRIPTION

Figure 1:
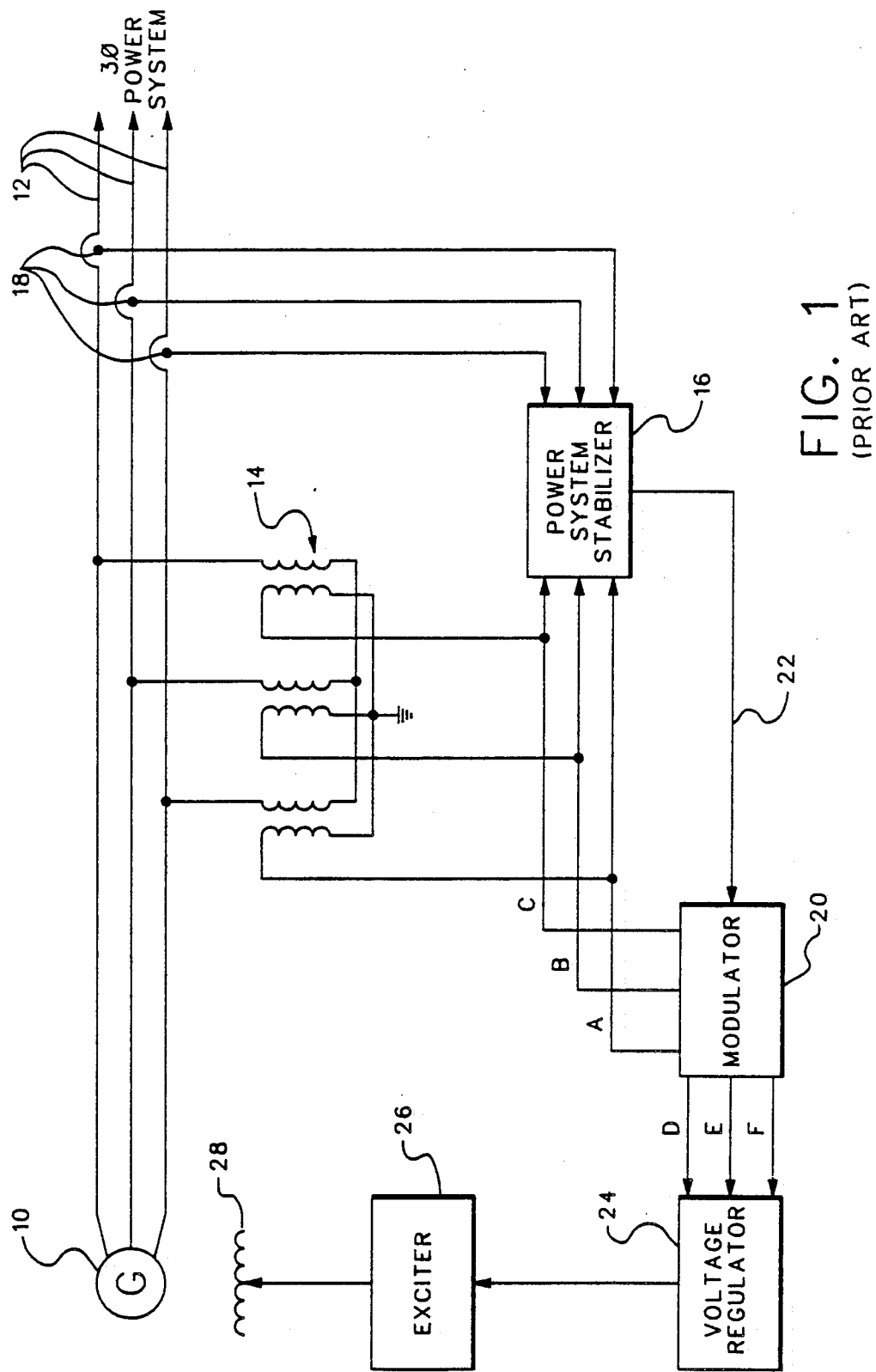
FIG. 1 is a block diagram of a three phase power system in accordance with the prior art.

Before beginning a description of the invention, it is believed appropriate to describe a prior art system in which the present invention is believed to have particular application. In this regard, reference is first made to FIG. 1 which is a major block diagram of this environmental system. Previous reference has been made to U.S. Pat. No. 4,855,644 which patent is specifically incorporated herein by reference. Those familiar with that patent will recognize FIG. 1 (as well as FIG. 2) as being taken therefrom. Specifically with reference now to FIG. 1, there is shown an AC synchronous generator 10 connected to a power system illustrated by lines 12. A potential transformer system, illustrated as a wye connected three-phase transformer 14, provides signals proportional to the generator terminal voltage to a power system stabilizer (PSS) 16 of the type known in the art. The voltage signals from the transformer 14 are also applied to a modulator 20, to which the present invention is directly applicable, by way of lines A, B, and C. The secondaries of the potential transformer 14 have their common point connected to ground.

Signals proportional to the output current of the generator 10 are derived by suitable current transformers 18. These signals are also provided to the power system stabilizer 16.

The power system stabilizer 16, in response to the input signals representing generator terminal voltage provides, on line 22, an oscillation signal which has an instantaneous value proportional to oscillations of the generator 10. This signal, via line 22, is applied to the modulator 20 such that the modulator output, on lines D, E and F (a control signal), will be the signals on lines A, B, and C as modified by the modulator 20 in accordance with the signal on line 22. Signals from the modulator are applied to a voltage regulator 24, of a customary type, the output of which is applied to an exciter 26 which, in turn, controls the excitation of the generator field winding 28.

The function of the modulator in this invention is to add to or subtract from (modulate) the generator terminal voltage signals on lines A, B, and C using the power system stabilizer output on line 22 so that the generator excitation current becomes modified in accordance with that latter signal.

Figure 2:
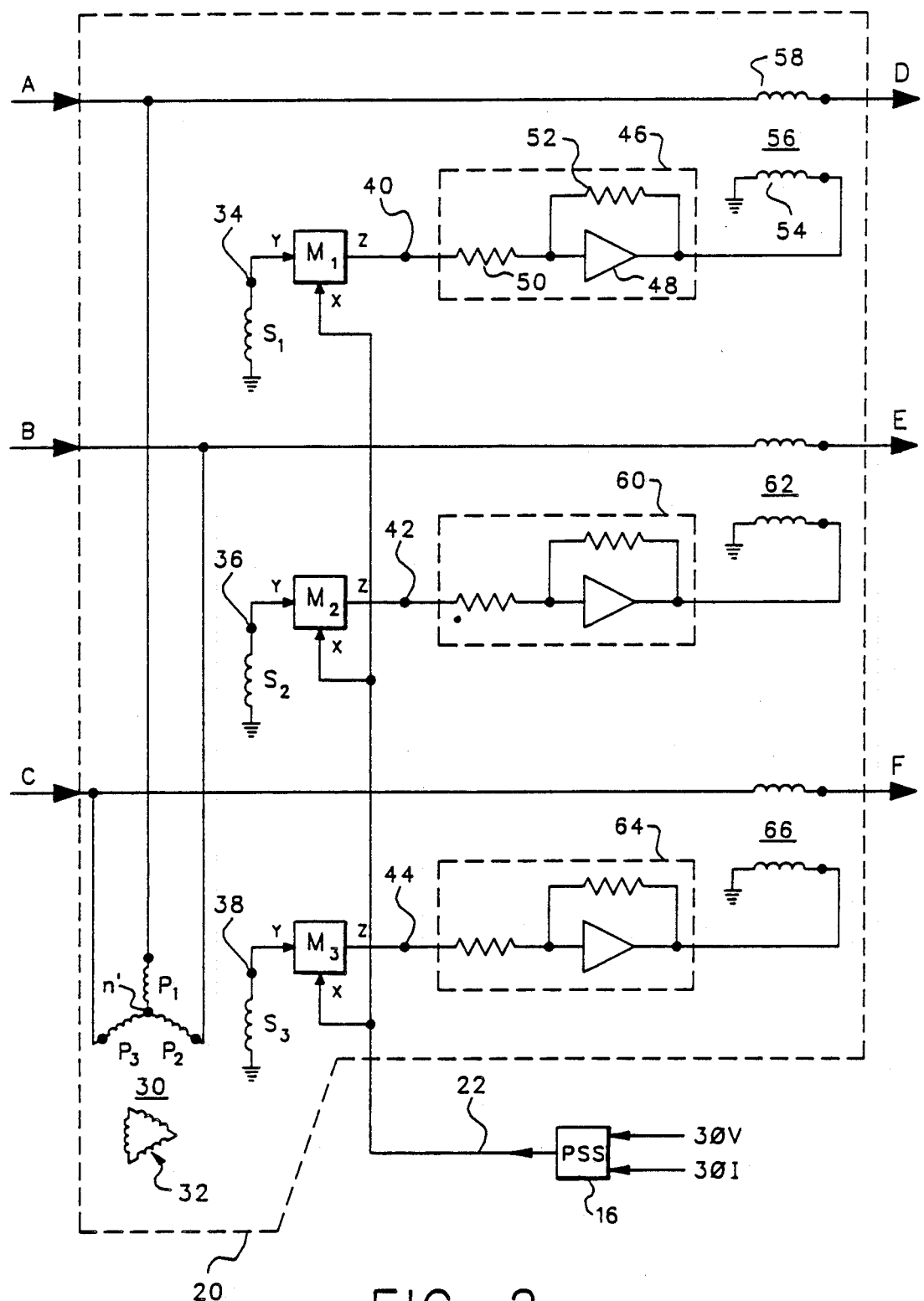
FIG. 2 is a schematic diagram of a portion of accordance with the prior art, which illustrates a preferred environment for employment of the method and apparatus of the present invention.

FIG. 2 illustrates the modulator 20 as it was presented in one embodiment of the aforementioned patent and further includes, as points of reference, the three input lines A, B, and C as well as the power system stabilizer 16 and its inputs. (The depiction of FIG. 2 is one of several implementations shown in the aforementioned patent and serves, as would all of the embodiments, as a suitable environment for the employment of the present invention.) Included within the modulator 20 is a transformer, indicated generally at 30, which includes a wye connected primary winding having primary windings $P_1$, $P_2$ and $P_3$ connected, respectively, to the three input lines A, B, and C. The common point (n') remains equal to the voltage at the neutral of the applied voltages. Three secondary windings $S_1$, $S_2$, and $S_3$ are connected in wye configuration with their common point being ground or neutral. A tertiary winding 32, connected in delta, is provided for the flow of the third harmonic currents to help establish the neutral point.

In accordance with standard transformer theory, the voltages across the secondary windings $S_1$, $S_2$ and $S_3$, with respect to neutral or ground, as seen respectively at nodes 34, 36 and 38, will be equal to the voltages on lines A, B, and C (with respect to neutral) times the ratio of the turns in the secondary to the primary windings. The three voltage signals at nodes 34, 36 and 38 are respectively applied as the "y" inputs to three multipliers $M_1$, $M_2$ and $M_3$. The second input (x) to each of the multipliers is the output of the power system stabilizer 16 on line 22. Each of the multipliers $M_1$, $M_2$ and $M_3$ is preferably a four quadrant multiplier which means that the outputs (z), as seen at the respective nodes 40, 42 and 44, are signals having magnitudes which are the products of the multiplier inputs and signs according to the relative signs of the inputs.

The signal at the node 40 is applied to a linear amplifier 46 which may be comprised, in the manner known in the art, of an operational amplifier 48 having input resistor 50 and a feedback resistor 52 connected between its output and its input. The output of the linear amplifier 46 is connected to one end of the primary winding 54 of the transformer 56 the other end of which is connected to ground. Transformer 56 further has a secondary 58 connected between the A input and the D output of modulator 20. The voltage induced into the secondary winding 58 will be proportional to the output of the multiplier $M_1$, as adjusted by the proportionality factor of the linear amplifier 46, and the turns ratio of the transformer. Since the secondary winding 58 is in series with the line from input A to output D, the voltage at the output D, with respect to neutral, will be equal to the algebraic sum of the voltage at A and the voltage induced into the secondary winding 58.

In a similar manner, the voltage at node 42 is applied to a linear amplifier 60 the output of which is applied to a transformer 62 in association with input B and output E. The voltage signal at node 44 is applied to a linear amplifier 64 whose output is supplied to a transformer 66 associated with input C and output F. As earlier described, with respect to FIG. 1, the signals on line D, E and F are applied to the voltage regulator 24 which in turn controls exciter 26 and hence, the field excitation on the generator in accordance with the teachings of the prior art.

For a more complete understanding of FIGS. 1 and 2 and the overall power system stabilizer system, as well as the other embodiments corresponding to that of FIG. 2, reference is again made to the aforementioned U.S. Pat. No. 4,855,644.

In this environment, that circuitry associated with the amplifiers 46, 60 and 64 is that of primary concern. The monitoring of this circuit is the result of the specific embodiment of the present invention. So long as the power system stabilizer output on line 22 is zero, the outputs of the multipliers will be zero. With zero inputs to the amplifiers, there will be no output to facilitate monitoring of the operational state of the amplifiers. Since this quiescent state may last for an extended period of time and the proper operational state of the amplifiers is critical to the functioning of the overall system, there has been an expressed desire to be able to continuously monitor this circuitry.

Figure 3:
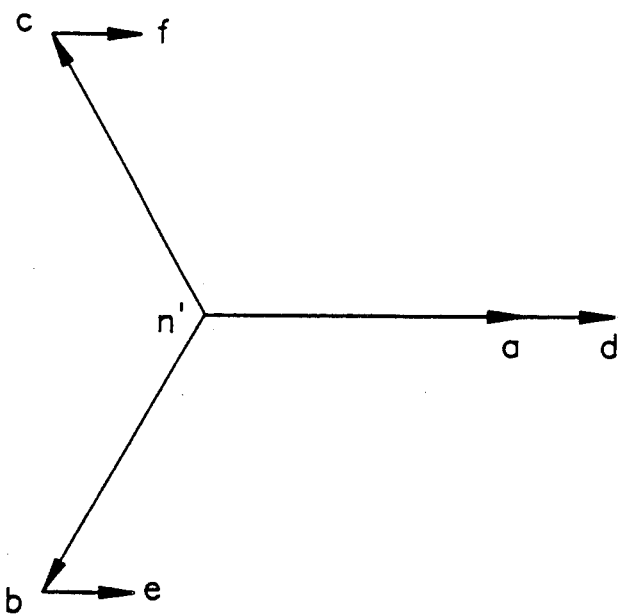
FIGS. 3, 4 and 5 are phasor diagrams illustrating a principal employed in the present invention.
Figure 4:
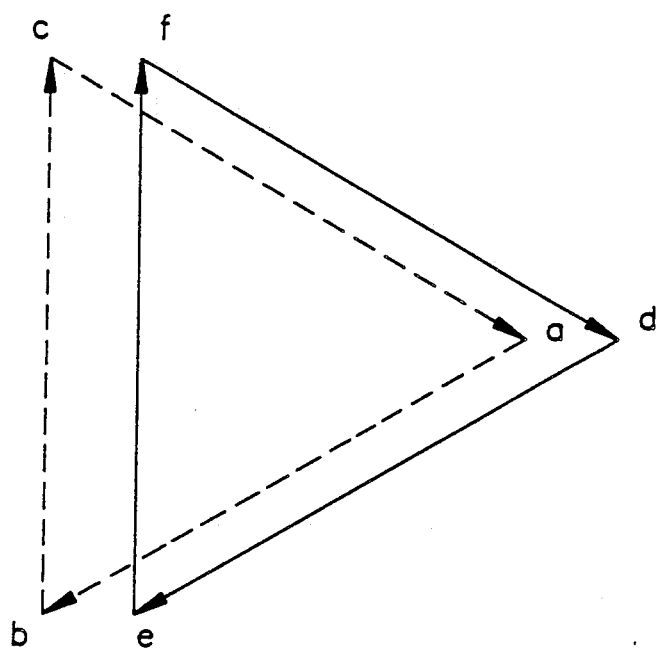
Figure 5:
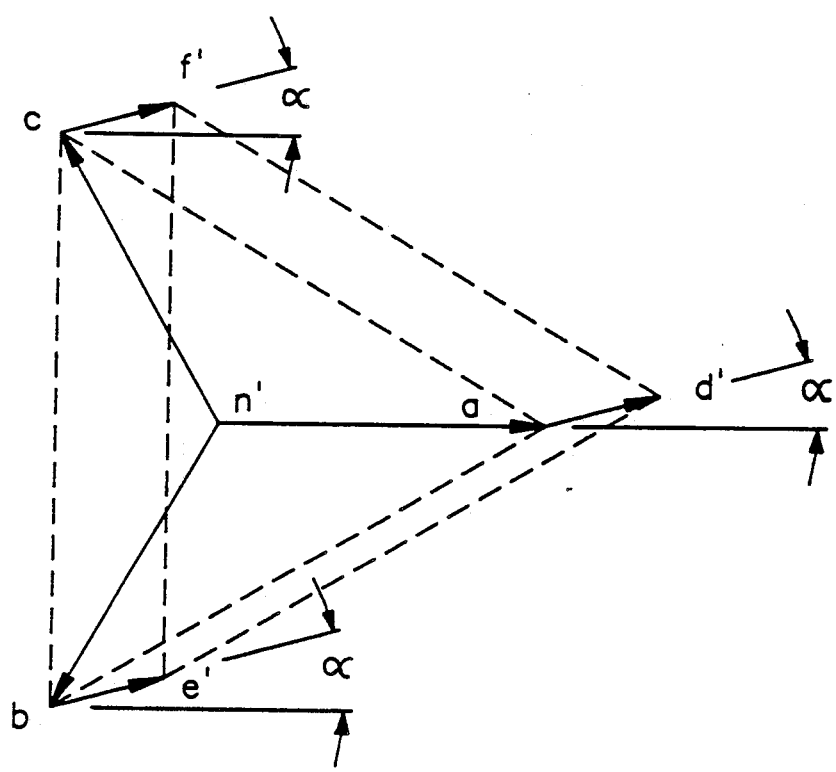

The phasor diagrams of FIGS. 3, 4 and 5 illustrate a concept employed in the present invention. FIG. 3 shows the three neutral-to-line voltages; i.e., n'-a, n'-b and n'-c. FIG. 4 shows, by the dashed line depiction, the corresponding line-to-line voltages, a-b, b-c and c-a. If now, as further illustrated by FIG. 3, there is added to each of the neutral-to-line voltages the identical vector voltage signal (i.e., phasors a-d, b-e and c-f) there is no change in the line-to-line voltage. This is shown in FIG. 4 by the solid line phasors d-e, e-f and f-d. Thus, relating d, e and f to the lines D, E and F in FIG. 2, it is apparent that the additions of the same phasor to the neutral-to-line inputs at nodes 34, 36 and 38 will have no effect on the line-to-line voltage signals between lines D, E, and F.

FIG. 5 shows that the angle ($\alpha$) of the additional phasor is immaterial with respect to the line-to-line voltage representations. The same can be shown to be true for other than three-phase systems although, obviously, the three-phase system is the most common. Thus, what is learned from the showing of these phasor diagrams is that, in a polyphase system, the addition of identical signals to representations of the neutral-to-line voltage signals, while affecting the neutral-to-line signal will not in any way change the line-to-line voltages representations.

Figure 6:
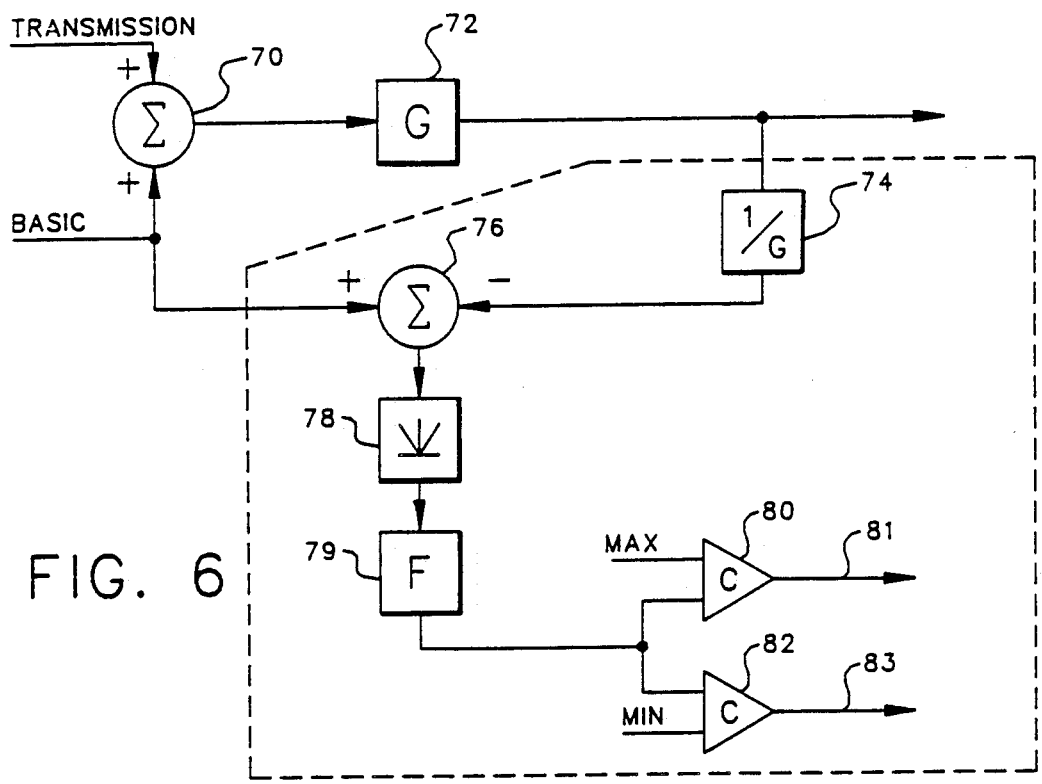
FIG. 6 is a block diagram illustrating an aspect of the present invention in a first embodiment.
Figure 7:
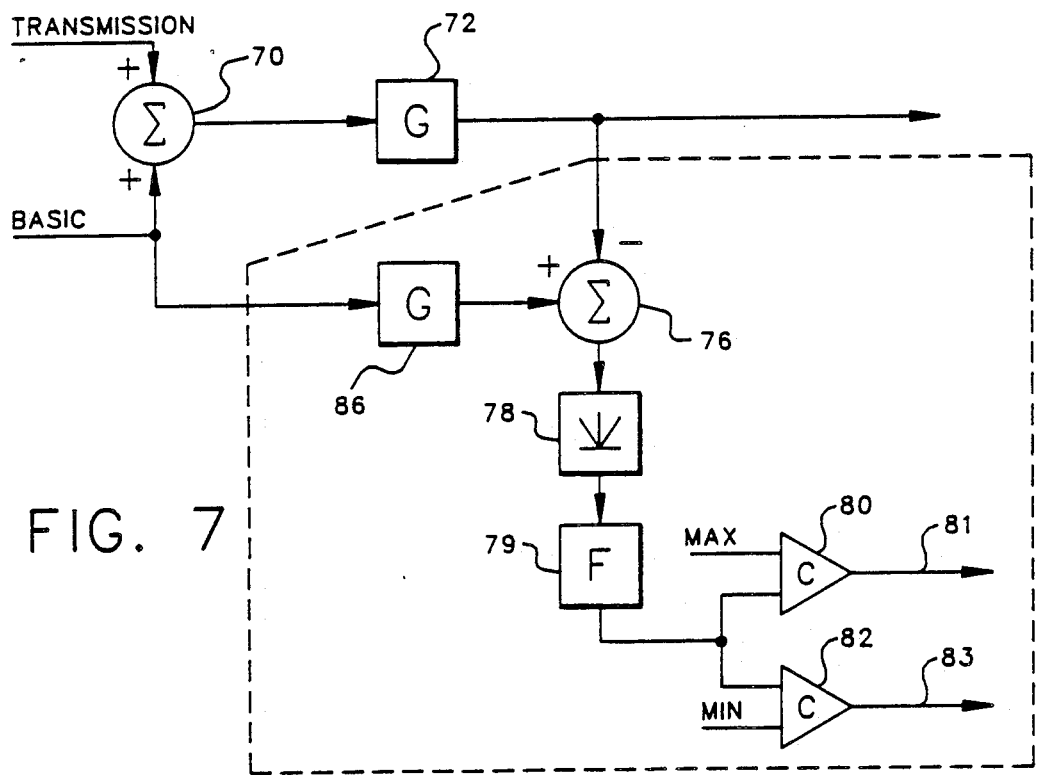
FIG. 7 is a block diagram illustrating an aspect of the present invention in second embodiment; and, FIG. 8 is a schematic diagram corresponding to FIG. 2 illustrating the present invention employed in a three phase application.

The employment of this concept in its most basic form is illustrated in FIGS. 6 and 7 which illustrate two embodiments of the basic inventive concept. Referencing first FIG. 6, two signals are applied to summing junction 70. These two signals are labeled "transmission" and "basic". With respect to the description of FIGS. 3, 4, and 5, the basic signal is the signal which is desired to be employed; i.e., the neutral-to-line voltage signals which have been modulated by the PSS output (line 22). The transmission signal is the additional phasor and has a root-mean-square (rms) value in excess of zero volts. In FIG. 6 both of these signals are provided in a positive sense to junction 70, the output of which is applied to an amplifier 72 having a prescribed gain G. The output of the amplifier 72 serves as one of the signals to the overall system, for example, in the FIG. 2 depiction this would correspond to one of the signals applied to a transformer 56, 62 or 66. The output of amplifier 72 is also applied to a second amplifier 74 which has a gain related to the gain of the amplifier 72, in this case 1/G. The output of the amplifier 74 is applied to a second summing junction 76 in a negative sense while the basic signal is applied in the positive sense. The output of junction 76 is applied to an absolute value circuit 78 the output of which is applied to a filter circuit 79 whose output serves as an input to each of two comparators 80 and 82. Comparators 80 and 82 have second inputs which are, respectively, reference signals defining desired maximum and minimum signal levels.

From the description above, if all the circuitry, particularly amplifier 72 which is the primary element being monitored, is functioning properly the output of the absolute value circuit 78 will be equal to the magnitude of the transmission signal, which, in accordance with the present invention and the preceding phasor diagrams always has some rms value other than zero. This remains true for all values of the basic signal including a zero value. If, however, amplifier 72 ceases to function and provides a zero output, then the output of the absolute magnitude circuit 78 will be equal to the value of the basic signal. As such, by properly adjusting the values of the maximum and minimum reference signals to the two comparators 80 and 82 as a function of allowable values of the transmission signal, the circuit can be made to provide a suitable alarm. This alarm can be an output of either of the two comparators on lines 81 and 83.

The FIG. 7 depiction is similar to that of FIG. 6 and differs primarily in that the output of the amplifier 72 is provided directly, in the positive sense to the junction 76 while the transmission signal is provided to an additional amplifier 86. Amplifier 86 has a gain equal to the gain of amplifier 72, that is, a gain of G. In this case, with all circuits working properly, the output of the absolute value circuit 78 will be equal to the absolute magnitude of the transmission signal as amplified by the amplifier 72. In all fundamental aspects, however, the concept is identical to that of FIG. 6.

Figure 8:
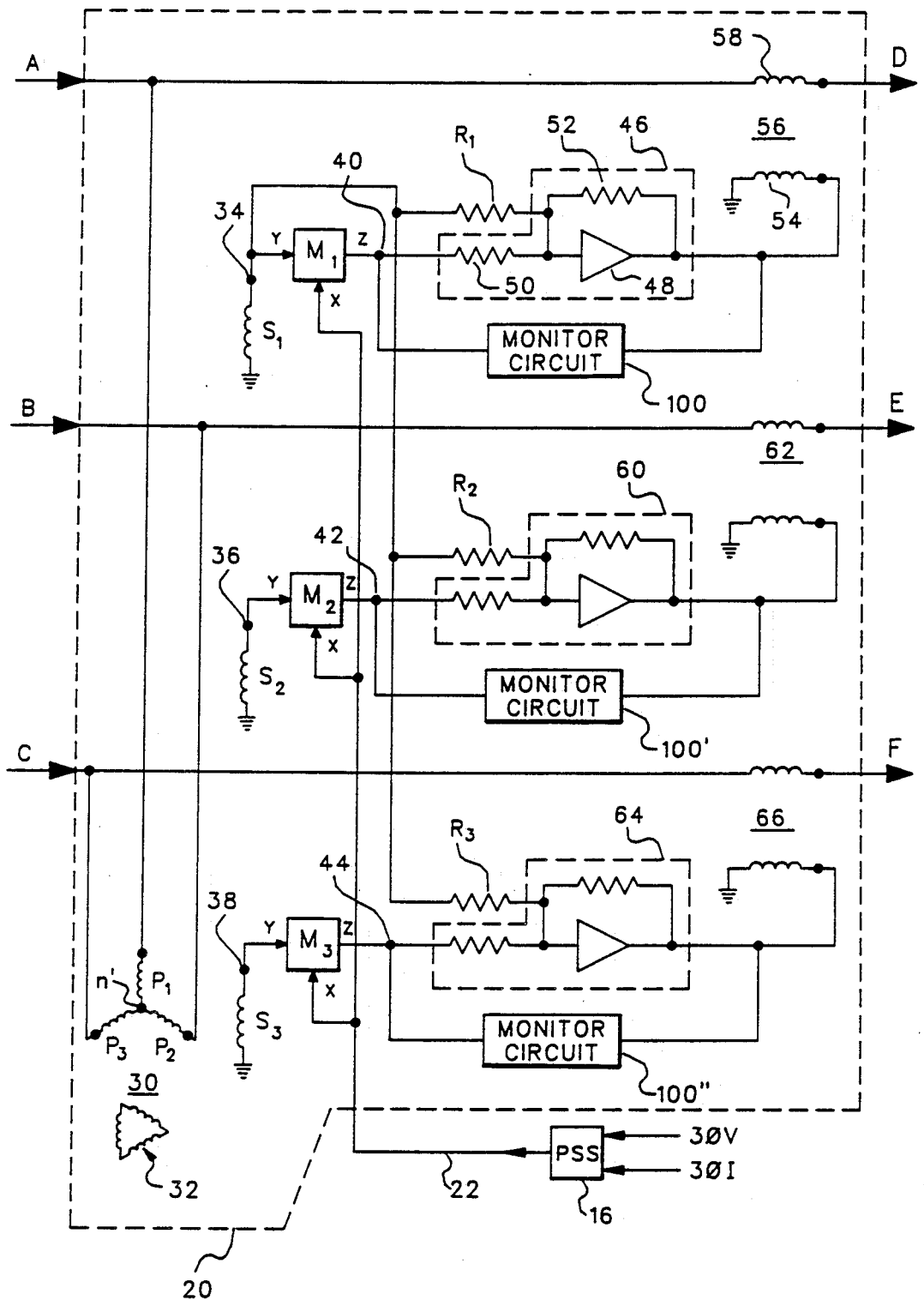

FIG. 8 demonstrates the application of the embodiments of either FIG. 6 or FIG. 7 to the FIG. 2 type environment. FIG. 8 is identical to FIG. 2 with the exception that the signal at node 34, a signal proportional to the neutral-to-line voltage of the A phase, is applied as an additional input to each of the amplifiers 46, 60 and 64. These are the transmission signals and are shown as being applied respectively thru resistors $R_1$, $R_2$ and $R_3$. Amplifiers 46, 60 and 64 correspond to the summation block 70 and the gain blocks 72. Blocks 100, 100′ and 100″, as the case may be are monitor circuits and, represent remaining circuitry as shown within the dashed line blocks of FIGS. 6 and 7.

In FIG. 8, so long as the generator is operational, a voltage will exist at node 34 and this voltage will be representative of the system voltage which, in normal circumstances will remain reasonably constant (e.g. ±10%). This signal at node 34 serves, in the terminology earlier employed as the "transmission" signal. The earlier denominated "basic" signal is, as appropriate, the output of a one of the multipliers $M_1$, $M_2$ or $M_3$ and is called the modulation signal in the aforementioned patent. This signal can, as was earlier described, be of zero value if the output of the power system stabilizer 16 is zero, denoting that the generator and the power system are operating in the quiescent state.

Thus it is seen that there is shown and described a scheme which enables the continuous monitoring of a circuit (or component), particularly an amplifier. This scheme, when used in a three-phase system, readily permits the utilization of the signals representing line-to-line voltages without affecting those representations. While the invention has been shown and described in its preferred embodiments, modifications thereto will readily occur to those skilled in the art. For example while the basic concept was shown only in the environment of one of the embodiments of the incorporated patent, as earlier stated this concept has equal applicability to each of the embodiments therein described. It is not desired, therefore, that the invention be limited to the specific embodiments shown and described and it is intended to cover within the appended claims all such modifications as fall within the true spirit and scope of the invention.

What is claimed is:

1. An amplifying system including means to continuously monitor the operational state of an amplifier circuit having a prescribed gain comprising:
   (a) means to provide first and second input signals to said amplifier circuit whereby said amplifier circuit normally yields an output signal proportional to the product of said prescribed gain and the sum of said input signals, said first input signal having a root-mean-square value in excess of zero volts;
   (b) means to generate a third signal by multiplying a selected one of said output signal and said second input signal by a factor representing said prescribed gain;
   (c) means to combine said third signal with the other of said output signal and said second input signal to yield an error signal; and,
   (d) means responsive to said error signal to provide an alarm signal when said error signal has a value outside a predetermined boundary.

2. The invention in accordance with claim 1 wherein said selected one is said output signal and wherein said means to generate said third signal includes an additional amplifier, responsive to said output signal, having a gain equal to the reciprocal of said prescribed gain.

3. The invention in accordance with claim 1 wherein said selected one is said second input signal and wherein said means to generate said third signal includes an additional amplifier, responsive to said second input signal, having a gain equal to said prescribed gain.

4. The invention in accordance with claim 2 wherein said means to combine yields said error signal as a function of the difference between said second input signal and said third signal.

5. The invention in accordance with claim 4 wherein said means responsive to said error signal includes means to determine the absolute magnitude of said error signal and means to generate said alarm signal when the absolute magnitude of the error signal is greater than or less than respective predetermined values defining said predetermined boundary.

6. The invention in accordance with claim 5 wherein said predetermined values are determined by a normal value of said first input signal.

7. The invention in accordance with claim 3 wherein said means to combine yields said error signal as a function of the difference between said third signal and said output signal.

8. The invention in accordance with claim 7 wherein said means responsive to said error signal includes means to determine the absolute magnitude of said error signal and means to generate said alarm signal when the absolute magnitude of the error signal is greater than or less than respective predetermined values defining said predetermined boundary.

9. The invention in accordance with claim 8 wherein said predetermined values are determined by a normal value of said first input signal.

10. The invention in accordance with claim 1 wherein said amplifier is an operational amplifier.

11. A system for stabilizing a polyphase synchronous generator providing an output voltage and an output current, through excitation control to dampen generator oscillations comprising:
   (a) a power system stabilizer means responsive to generator operating parameters to develop an oscillation signal having an instantaneous magnitude proportional to said generator oscillations;
   (b) means to develop a plurality of voltage signals representing, respectively, phase output voltages of said generator with respect to neutral;
   (c) means to multiply each of said voltage signals by said oscillation signal to yield a corresponding plurality of modulation signals;
   (d) an amplifier for each phase of said generator, each of the amplifiers having a prescribed gain and being responsive, respectively, to the sum of a corresponding one of said modulation signals and a one of said voltage signals to provide an associated control signal to control the excitation of said generator; and
   (e) means to continuously monitor the operational status of each of the amplifiers including:
      (i) means to generate an additional signal by multiplying a selected one of the associated control signal and said modulation signal by a factor representing said prescribed gain;
      (ii) means to combine said additional signal and the other of the associated control signal and said modulation signal to yield an error signal; and,
      (iii) means responsive to said error signal to provide an alarm signal when said error signal has a value outside a predetermined boundary.

12. The invention in accordance with claim 11 wherein said selected one is said associated control signal and wherein said means to generate the additional signal includes an additional amplifier, responsive to said associated control signal, having a gain equal to the reciprocal of said prescribed gain.

13. The invention in accordance with claim 11 wherein said selected one is said modulation signal and wherein said means to generate said additional signal includes an additional amplifier, responsive to said modulation signal, having a gain equal to said prescribed gain.

14. The invention in accordance with claim 12 wherein said means to combine yields said error signal as a function of the difference between said modulation and said additional signal.

15. The invention in accordance with claim 14 wherein said means responsive to said error signal includes means to determine the absolute magnitude of said error signal and means to generate said alarm signal when the absolute magnitude of the error signal is greater than or less than predetermined values defining said predetermined boundary.

16. The invention in accordance with claim 15 wherein said predetermined values are determined by a normal value of the one of said voltage signals.

17. The invention in accordance with claim 13 wherein said means to combine yields said error signal as a function of the difference between said additional signal and said associated control signal.

18. The invention in accordance with claim 17 wherein said means responsive to said error signal includes means to determine the absolute magnitude of said error signal and means to generate said alarm signal when the absolute magnitude of the error signal is greater than or less than predetermined values defining said predetermined boundary.

19. The invention in accordance with claim 18 wherein said predetermined values are determined by a normal value of the one of said voltage signals.

20. The invention in accordance with claim 11 wherein each of said amplifier means for each generator phase is an operational amplifier.

21. A method of continuously monitoring the operational state of an amplifier having a prescribed gain comprising:
   (a) providing to said amplifier a first input signal having a root-mean-square value greater than zero and a second input signal whereby said amplifier normally yields an output signal proportional to the product of said prescribed gain and the sum of said input signals;
   (b) generating a third signal by multiplying a selected one of said output signal and said second input signal by a factor representing said prescribed gain;
   (c) combining said third signal with the other of said output signal and said second input signal to yield an error signal; and,
   (d) generating an alarm signal when said error signal has a value beyond a predetermined value.

22. The invention in accordance with claim 21 wherein the step of generating said third signal includes the multiplication of said output signal by a gain equal to the reciprocal of said prescribed gain.

23. The invention in accordance with claim 21 wherein the step of generating said third signal includes multiplication of said second input signal by a gain equal to said prescribed gain.

24. The invention in accordance with claim 22 wherein the combining step includes combining said third signal and said second input signal to yield said error signal as a function of the difference between said second input signal and said third signal.

25. The invention in accordance with claim 24 further including a step of determining the absolute magnitude of said error signal and generating said alarm signal when the absolute magnitude of said error signal is greater than said predetermined value or when said absolute magnitude of said error signal is less than a second predetermined value.

26. The invention in accordance with claim 23 wherein the combining step includes combining said third signal and said output signal to yield said error signal as a function of the difference between said third signal and said output signal.

27. The invention in accordance with claim 26 further including a step of determining the absolute magnitude of said error signal and generating said alarm signal when said absolute magnitude of said error signal is greater than said predetermined value or when said absolute magnitude of said error signal is less than a second predetermined value.

* * * * *